US010784652B2

(12) United States Patent
Davies et al.

(10) Patent No.: US 10,784,652 B2
(45) Date of Patent: *Sep. 22, 2020

(54) ACTIVE MODE CENTRE CONTROL

(71) Applicant: Oclaro Technology Limited, Towcester, Northamptonshire (GB)

(72) Inventors: Samuel Davies, Woodford Halse (GB); Andrew John Ward, Northampton (GB); Andrew Cannon Carter, Blisworth (GB)

(73) Assignee: Lumentum Technology UK Limited, Northamptonshire (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/331,927

(22) PCT Filed: Sep. 27, 2017

(86) PCT No.: PCT/GB2017/052885
§ 371 (c)(1),
(2) Date: Mar. 8, 2019

(87) PCT Pub. No.: WO2018/060694
PCT Pub. Date: Apr. 5, 2018

(65) Prior Publication Data
US 2019/0207366 A1    Jul. 4, 2019

(30) Foreign Application Priority Data
Sep. 30, 2016  (GB) ..................... 1616630

(51) Int. Cl.
*H01S 5/00*  (2006.01)
*H01S 5/0625*  (2006.01)
(Continued)

(52) U.S. Cl.
CPC ........ *H01S 5/06256* (2013.01); *H01S 5/0264* (2013.01); *H01S 5/0612* (2013.01);
(Continued)

(58) Field of Classification Search
CPC .. H01S 5/06256; H01S 5/0264; H01S 5/0612; H01S 5/0617; H01S 5/06255;
(Continued)

(56) References Cited

U.S. PATENT DOCUMENTS 6,359,915 B1    3/2002  Koch et al.
6,504,856 B1 *  1/2003  Broberg ............. H01S 5/06808
                                                         372/20
(Continued)

FOREIGN PATENT DOCUMENTS

EP          1130718 A2      9/2001
WO      WO 99/40654 A1      8/1999

OTHER PUBLICATIONS

GB Search Report, GB Application No. GB1616630.8, dated Mar. 1, 2017, 4 pages.
(Continued)

*Primary Examiner* — Kinam Park
(74) *Attorney, Agent, or Firm* — Harrity & Harrity, LLP

(57) ABSTRACT

There is disclosed a DBR laser and a method of use. The DBR laser comprises a phase section in a cavity of the DBR laser and configured to adjust an optical path length of the cavity. A DBR section comprises a frequency tuning system configured to adjust a Bragg frequency of the DBR section. A detector is configured to detect laser light transmitted through the DBR section. A controller is configured: to cause the phase section to apply a dither to the optical path length of the cavity or cause the frequency tuning system to apply a dither to the Bragg frequency of the DBR section; to use the detector to monitor intensity of light transmitted from the
(Continued)

laser cavity via the DBR section during application of the dither; to determine a deviation from longitudinal mode centre operation on the basis of the monitored intensity; and to cause the frequency tuning system to adjust the Bragg frequency of the DBR section in order to reduce said deviation, or cause the phase section to adjust the optical path length of the cavity in order to reduce said deviation.

20 Claims, 5 Drawing Sheets

(51) Int. Cl.
    *H01S 5/026*     (2006.01)
    *H01S 5/06*     (2006.01)
    *H01S 5/0687*     (2006.01)
    *H01S 5/125*     (2006.01)
    *H01S 5/065*     (2006.01)
    *H01S 5/068*     (2006.01)
    *H01S 5/0683*     (2006.01)

(52) U.S. Cl.
    CPC .......... *H01S 5/0617* (2013.01); *H01S 5/0654* (2013.01); *H01S 5/0683* (2013.01); *H01S 5/0687* (2013.01); *H01S 5/06255* (2013.01); *H01S 5/06821* (2013.01); *H01S 5/125* (2013.01); *H01S 5/0601* (2013.01); *H01S 5/0607* (2013.01)

(58) Field of Classification Search
    CPC .... H01S 5/0654; H01S 5/0687; H01S 5/0683; H01S 5/125; H01S 5/0607; H01S 5/0601
    See application file for complete search history.

(56) References Cited

U.S. PATENT DOCUMENTS

| | | |
|---|---|---|
| 10,522,972 B2 * | 12/2019 | Carter .................... H01S 5/125 |
| 2003/0035449 A1 | 2/2003 | Tomlinson et al. |
| 2006/0193354 A1 | 8/2006 | Rosenblatt |
| 2015/0288140 A1 | 10/2015 | Davies et al. |

OTHER PUBLICATIONS

PCT International Search Report and Written Opinion, PCT Application No. PCT/GB2017/052885, dated Dec. 19, 2017, 15 pages.
Woodward, S.L. et al., "A Control Loop Which Ensures High Side-Mode-Suppression Ratio in a Tunable DBR Laser," IEEE Photonics Technology Letters, May 1992, pp. 417-419, vol. 4, No. 5.

* cited by examiner

ACTIVE MODE CENTRE CONTROL

RELATED APPLICATIONS

This application is a 35 U.S.C. 371 national stage filing of International Application No. PCT/GB2017/052885, filed on Sep. 27, 2017, which claims priority from United Kingdom Application No. GB1616630.8 filed on Sep. 30, 2016. The contents of the aforementioned applications are hereby incorporated by reference in their entireties.

FIELD OF THE INVENTION

The present invention relates to a Distributed Bragg Reflector (DBR) laser. In particular, the invention relates to methods of controlling the laser which ensure mode centre operation, and a laser implementing such methods.

BACKGROUND

The term "light" as used herein refers to any part of the electromagnetic spectrum, including but not limited to visible light and radio frequency.

Tuneable Distributed Bragg Reflector (DBR) lasers are used to provide accurate, controllable frequency laser light. However, while the laser drive currents can be accurately calibrated at the time of manufacture to achieve both the required channel frequency and to operate at the centre of one of the laser's longitudinal modes, as the laser ages various of its characteristics will change, which can lead to a drift in both frequency and the position of the operating point within the longitudinal mode.

The optical path length of the laser cavity defines longitudinal modes. The frequencies of the longitudinal modes are such that the round-trip phase for light of that frequency is an integer multiple of 2pi radians. In a typical DBR laser this round trip phase can be adjusted by, for example, injecting current into a small length of the laser cavity known as a 'phase section' thereby altering the refractive index and therefore the optical path length locally in that section.

In a DBR laser, frequency selectivity is achieved using a length of grating, known as a distributed Bragg reflector (DBR) at one end the cavity. When the frequency of the peak reflectivity of the grating (Bragg frequency) is aligned to the frequency of one of the longitudinal modes lasing can occur with high efficiency in that longitudinal mode and the laser is said to be operating at the mode centre. When the Bragg frequency and the longitudinal mode frequency move apart (either due to changes in the DBR section, the phase section or other parts of the laser cavity over life) the laser will continue to lase at the longitudinal mode frequency, but reflection from the grating is no longer maximised. This typically results in degraded laser performance—increased threshold current, reduced output power and reduced side mode suppression ratio (SMSR). The laser is said to be operating away from mode centre. If this detuning continues to increase eventually the laser will jump from one longitudinal mode to a more favourable one—one where the detuning between the longitudinal mode frequency and the Bragg frequency is reduced. Such a jump is associated with a large change in lasing/output frequency and is highly undesirable.

In current designs the lasing frequency is controlled over life without any attempt to maintain operation at the mode centre. The frequency is typically controlled by means of an external frequency reference, such as an etalon, used as a frequency locker. The laser frequency is corrected by adjusting some control parameter (such as the phase section current, or the overall chip temperature) that adjusts the optical cavity length and hence the longitudinal mode frequencies. Once the correction from the start of life calibrated value of that parameter becomes greater than a predetermined limit then the laser is deemed to have reached the end of its life. This is to ensure that there is minimal risk of a longitudinal mode jump during operation. However, since the wavelength locker has no information on the actual proximity of such a jump the laser life is being artificially shortened and the risk of mode jumps cannot be completely eliminated.

SUMMARY

It is desirable to provide a means to determine and correct for any drift away from mode centre as well as correcting for laser frequency drift. This would both reduce the risk of mode jumps and extend the lifetime of the laser.

In accordance with one aspect of the present invention there is provided a DBR laser. The DBR laser comprises a phase section in a cavity of the DBR laser configured to adjust an optical path length of the cavity. The laser also includes a DBR section comprising a frequency tuning system configured to adjust a Bragg frequency of the DBR section. A detector is configured to detect laser light transmitted through the DBR section. A controller is configured: to cause the phase section to apply a dither to the optical path length of the cavity or cause the frequency tuning system to apply a dither to the Bragg frequency of the DBR section; to use the detector to monitor intensity of light transmitted from the laser cavity via the DBR section during application of the dither; to determine a deviation from longitudinal mode centre operation on the basis of the monitored intensity; and to cause the frequency tuning system to adjust the Bragg frequency of the DBR section in order to reduce said deviation, or cause the phase section to adjust the optical path length of the cavity in order to reduce said deviation.

In accordance with another aspect of the present invention there is provided a method of operating a DBR laser. The method comprises applying a dither to one or both of a Bragg frequency of a DBR section of the DBR laser and the optical path length of a cavity of the DBR laser. The intensity of light transmitted through the DBR section of the DBR laser is monitored. A deviation from longitudinal mode centre operation is determined on the basis of the monitored intensity. The method further includes adjusting either the Bragg frequency of the DBR section or the optical path length of the cavity in order to reduce said deviation.

Further aspects and preferred features are set out in claim 2 et seq.

DETAILED DESCRIPTION

When light is incident on a Bragg reflector, a certain fraction of the incident light will be reflected (R), a certain fraction transmitted through the reflector (T) and a certain fraction absorbed (A). R+A+T=1. When a DBR laser is operating at mode centre, R is maximised for the rear DBR section. It is not feasible to measure R directly. However since A is typically small measuring T can be used to give an approximate measure of R (R≈1−T).

Figure 1:
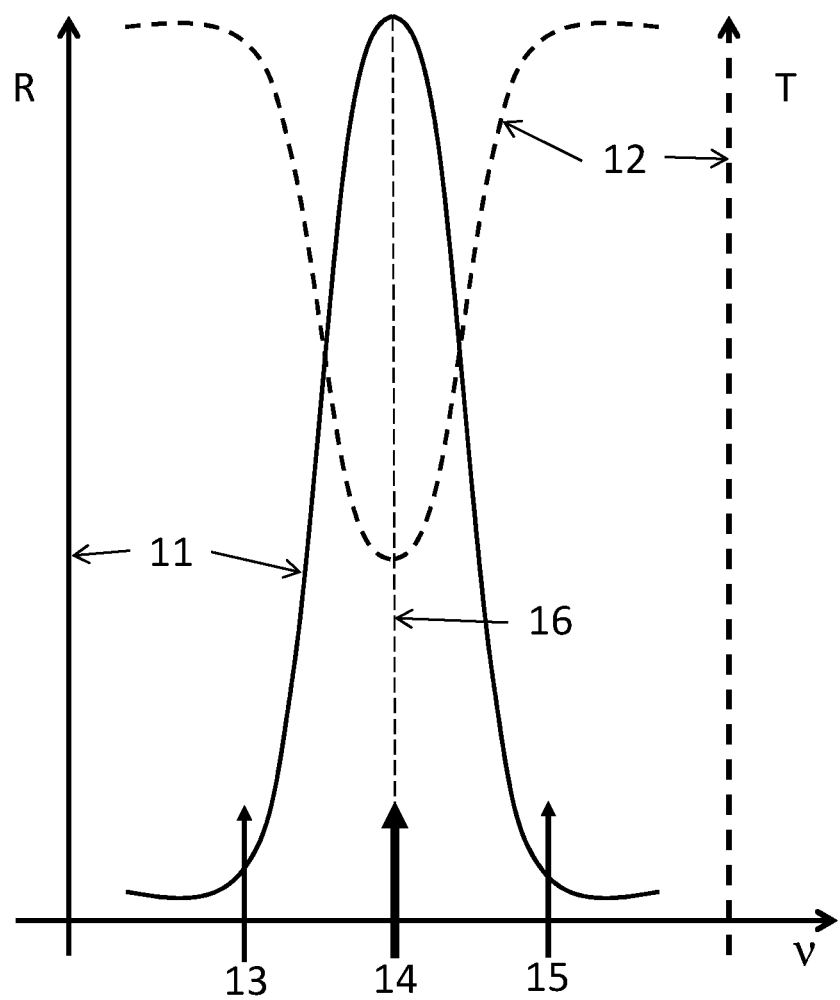
FIG. 1 is a graph of reflectance and transmission against frequency for a DBR section.

FIG. 1 shows a graph of R (11) and T (12) against frequency for a DBR section in a DBR laser. The maximum in R (and minimum in T) correspond to the characteristic frequency of the DBR. The frequencies of some of the longitudinal modes of the laser 13-15 are also shown on the frequency axis for a given optical path length of the cavity. Longitudinal mode 14 is the lasing mode in this example (i.e. the mode in which the laser is operating). As can be seen, in this example the longitudinal mode is at the same frequency (16) as the characteristic frequency of the DBR, so the value of R is maximised, and the value of T is minimised for the lasing frequency (i.e. the longitudinal mode frequency.

Figure 2:
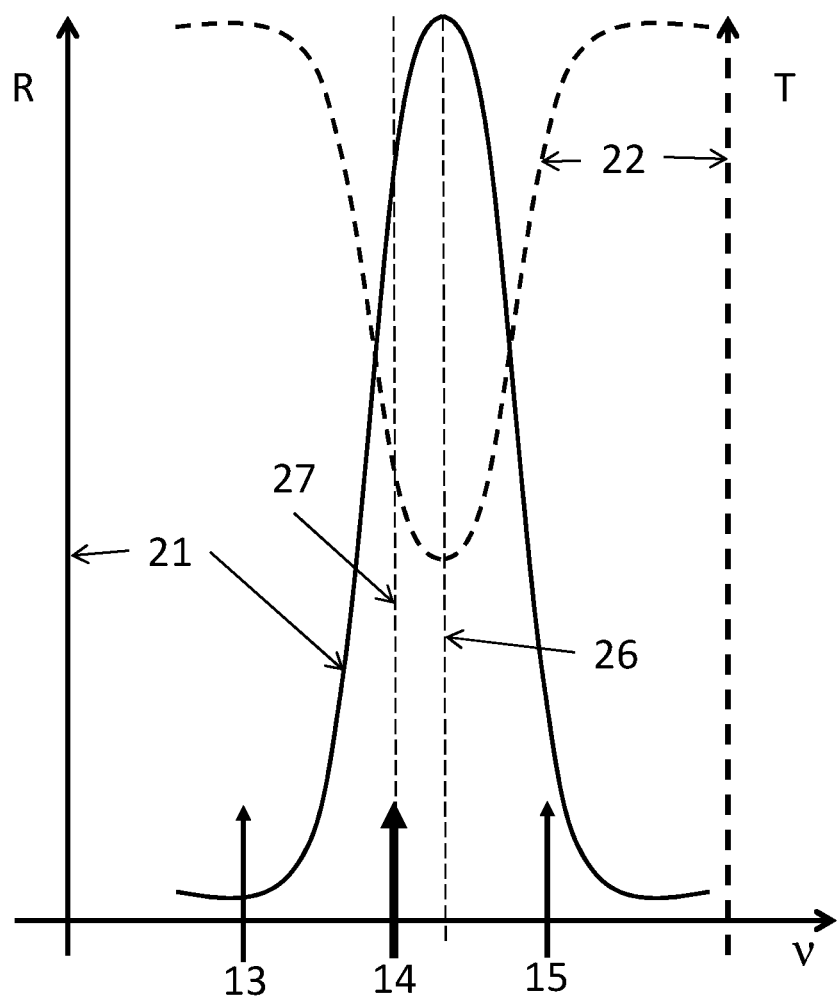
FIG. 2 is a graph of reflectance and transmission against frequency for a DBR section operating off mode centre.

FIG. 2 shows a graph of R (21) and T (22) against frequency for a DBR in a laser operating off mode centre. In this example, the optical path length of the cavity is the same as in FIG. 1, so the frequencies of the longitudinal modes are the same. However, the characteristic frequency (26) of the DBR is different, so the longitudinal mode frequency (27) (i.e. the lasing frequency) no longer lines up with the maximum in R. Where the maximum in R is still closest to the preferred mode 14 (as shown in FIG. 2), the laser will still operate in that mode. If the DBR frequency was closer to an adjacent mode, the laser could hop into that mode (e.g. mode 15), causing it to operate with a different lasing frequency.

The optical power transmitted through the rear DBR section can be detected by placing a detector behind the rear DBR section. Such a detector can be on-chip or off-chip. The detector may be a detector that is part of the frequency locker assembly.

The DBR section requires a frequency tuning system for adjusting the Bragg frequency of the DBR. This may be a control electrode that can alter the Bragg frequency of the DBR. This control electrode may inject current into the DBR section to alter its refractive index and hence the Bragg frequency. Alternatively the control electrode may drive a local heater that alters the temperature of the DBR section and hence alters the Bragg frequency. In additional to any DC control current, a low frequency 'dither' is applied to the DBR frequency tuning system, and the change in transmitted intensity due to that dither can be used to determine the distance from mode centre.

Figure 3:
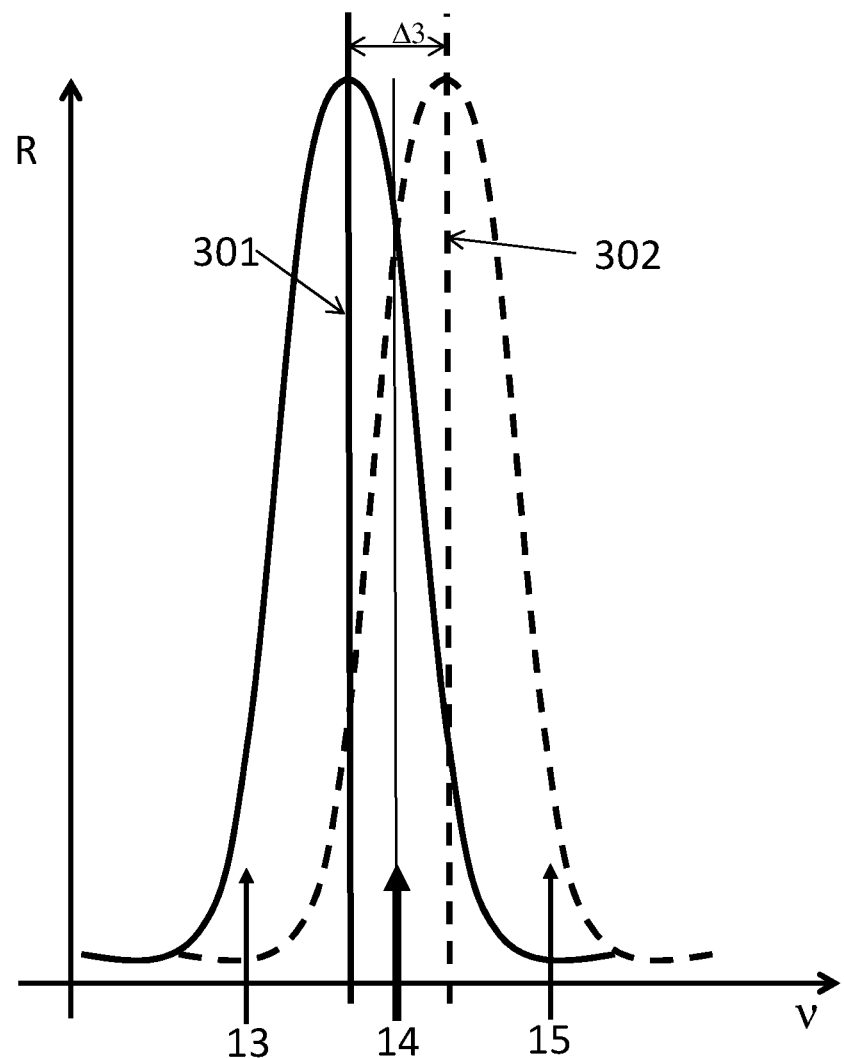
FIG. 3; illustrates DBR section current dithering

FIG. 3 illustrates the application of the dither to the DBR section. For clarity, only the R plot for each value of the DBR frequency is shown. The DBR frequency is configured to vary (Δ3) between a minimum 301 (solid) and a maximum 302 (dotted), while lasing continues on the same longitudinal mode (14). The transmitted intensity is measured during this variation. Mode centre corresponds to the maximum in reflected intensity or minimum in the transmitted intensity in this example. Since the absolute value of the transmitted intensity depends on many factors, not just the distance from mode centre, the variation of the intensity must be used to locate the minimum in the transmitted intensity. At mode centre the amplitude variation in the transmitted intensity during the dither is minimised. Away from mode centre the amplitude variation in the transmitted intensity during the dither is greater and it changes sign depending on whether the Bragg frequency at the centre of the dither range is greater than or less than the longitudinal mode frequency. The magnitude and sign of this amplitude variation can then be used to adjust DC current applied to the DBR section control electrode to move towards the mode centre.

Figure 4:
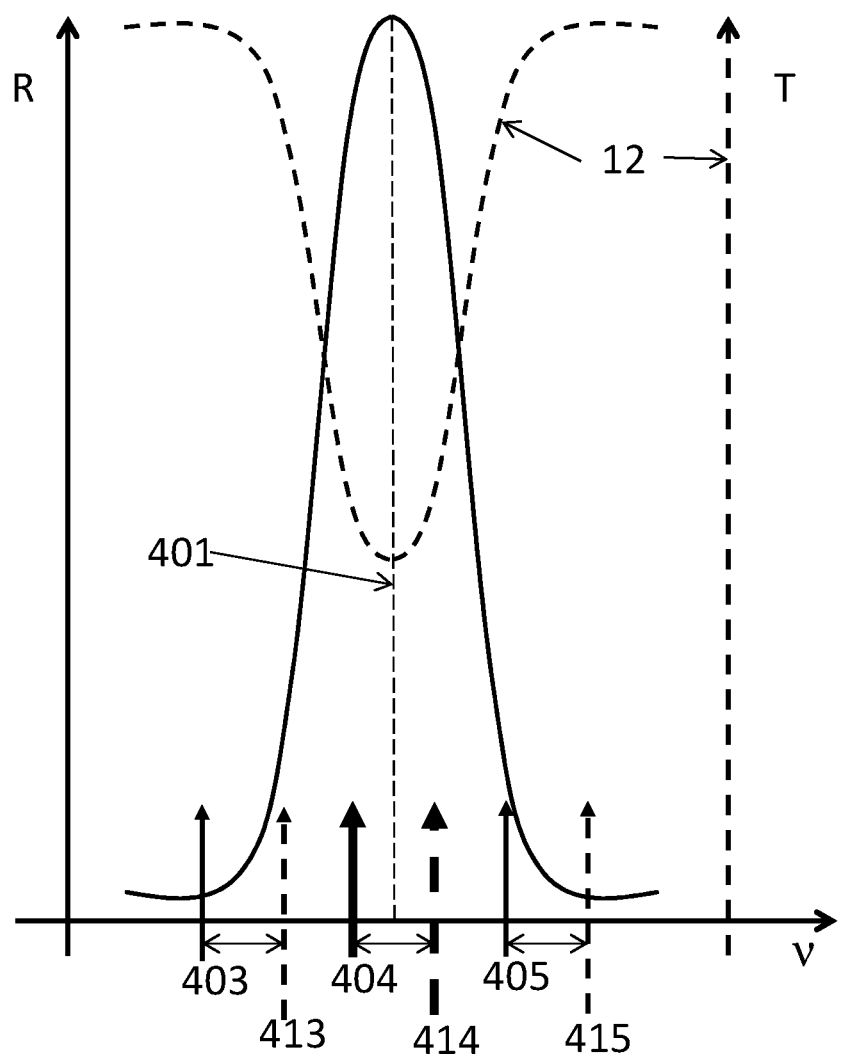
FIG. 4 illustrates phase section current dithering.

Alternatively, the dither may be applied to the phase section of the laser, or some other tuning parameter which adjusts the optical path length of the cavity. This has the disadvantage that it causes a shift in the longitudinal mode, and hence the output frequency of the laser, but in certain applications it may be useful (e.g. where the dither is within the tolerance required for the laser). This can be understood with reference to FIG. 4. The DBR frequency 401 remains stationary, and the optical path length of the cavity is varied to vary the frequency of the longitudinal modes between a minimum (403, 404, 405, solid lines) and a maximum (413, 414, 415, dashed lines). As the laser continues to lase on the mode closest to the DBR frequency, the lasing frequency of the laser will vary with the frequency of this mode (i.e. between the minimum 404 and maximum 414 frequencies of the mode). As with the DBR frequency dither, mode centre corresponds to the maximum reflected intensity (and thereby to the minimum transmitted intensity in this example). Away from mode centre the amplitude variation in the transmitted intensity during the dither is greater and it changes sign depending on whether the Bragg frequency at the centre of the dither range is greater than or less than the longitudinal mode frequency. The magnitude and sign of this amplitude variation can then be used to adjust DC current applied to the DBR section control electrode to move towards the mode centre.

In some embodiments, the optical path length of the cavity may be adjusted to move the laser to mode centre (e.g. by applying current to the phase section), in addition to or instead of adjusting the DBR section. In general, adjustment of the DBR section is preferred, as the optical path length of the cavity will be set by the desired frequency.

This mode centre correction can be applied in addition to the usual laser frequency correction driven by the frequency locker. The frequency locker functions by monitoring the output frequency of the laser, and adjusting the optical path length of the cavity to move the output frequency to the required output frequency (by adjusting the frequency of the longitudinal mode). In a conventional laser, the tuning of the DBR will be determined from the required output frequency at the start of life, and will not be adjusted by the frequency locker as the laser ages. However, errors in the calibration of the DBR (e.g. due to aging) mean that the DBR will not necessarily be tuned to the correct output frequency. Using the proposed mode centre control, the tuning of the DBR will be maintained by the mode centre correction.

If the dither is be applied with an oscillation frequency lower than the response speed of the frequency locker for the laser output, this can ensure that the dither does not have any effect on the output frequency of the laser.

The dither may be applied constantly, with constant monitoring to ensure that the laser operates on mode centre. Alternatively, since mode boundary drift is a slow process, for some lasers it may be practical for the dither may be applied only as part of a calibration routine, e.g. once every hour, every day, every month, every 6 months, etc. During such calibration the dither may be applied only until mode centre operation is detected (e.g. if the laser is still operating at mode centre, or following adjustment to return the laser to mode centre), or it may be applied for a set time.

If the laser is found to be operating off mode centre, then the DBR section of the laser is adjusted to return it to mode centre operation. This ability to adjust to mode centre operation will significantly improve the operating life of the laser, as a laser will only become unreliable due to mode boundary drift when that drift exceeds the ability of the DBR section to compensate (i.e. the adjustment required would be larger than can be provided by the DBR section).

Figure 5:
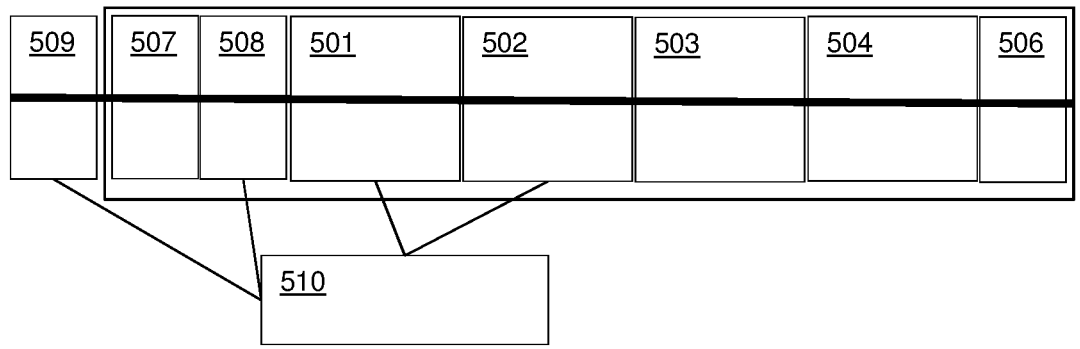
FIG. 5 is a schematic representation of an exemplary DBR laser.

FIG. 5 shows a schematic representation of an exemplary DBR laser. The DBR laser comprises a rear DBR section 501, a phase section 502, a gain section 503, a front reflector 504, a front facet 506, a rear facet 507, and frequency locker (not shown). The DBR laser also includes at least one of an on-chip detector 508, or an external detector 509 for detecting transmitted intensity of the rear DBR section. The DBR laser also includes a controller 510 for implementing mode centre control. The controller causes the rear DBR section to apply a dither, and monitors the power/intensity detected by the detector (i.e. transmitted by the rear DBR section). The controller uses the monitored intensity to determine a deviation from mode centre operation, and then causes the DBR controller to adjust the DBR section current in order to reduce the deviation.

It will be noted that only the controller 510, rear DBR 501, phase section 502 and detector 508 or 509 are relevant to mode centre control, and the use of mode centre control does not depend on the design of the other components of the DBR laser. For example, although the example shown includes a front reflector 504 and separate front facet 506, in some arrangements the front facet and front reflector may be a single entity.

While mode centre control has been described above with relation to a laser with a rear DBR section and a front reflector, it is equally applicable to a laser with a front DBR section and a rear reflector, or with both the front and rear reflectors being DBR sections. In each case, the detectors should be placed to detect transmitted intensity from (one of) the DBR section(s). Where a detector is placed to detect transmitted intensity from a front DBR section, it should be done in such a way as to still allow an output of light from the laser, e.g. using a beam splitter to "branch off" part of the transmitted light to the detector, or using a detector which allows the beam to pass through with only some modest reduction in intensity.

The controller may be implemented by software running on a generic processor, or by circuitry configured to perform the required functions, by some combination of the two, or by other suitable means.

In electronically tuned lasers (i.e. lasers with an electronically tuned rear DBR section), the relationship between transmission intensity and mode centre operation will generally be complex, because the electronic tuning causes variation in the absorption of the rear DBR section. The changes in carrier density in the rear DBR section, and associated changes in refractive index, caused by this optical absorption, lead to a chirp in the DBR which distorts the transmitted power function across each longitudinal mode—the minimum transmission no longer lines up with the maximum reflection (i.e. mode centre).

Mode centre detection in an electronically tuned laser can either be implemented by compensating for the absorption following detection of the transmitted intensity (e.g. by deliberately offsetting from the apparent mode centre obtained from minimum transmission), or before detection by engineering "counter-chirp" into the rear DBR section waveguide, which will correct for the absorption induced chirp introduced by the electronic tuning.

In thermally tuned lasers (i.e. lasers with a thermally tuned rear DBR section), there is much less absorption of the rear DBR section, and so no compensation is required.

The detection of transmitted intensity may be implemented by means of a lock-in amplifier. The lock-in amplifier is tuned to the oscillation frequency of the dither signal, and will amplify any features of the transmitted intensity signal which have the same frequency as that dither signal—i.e. features which arise from the dither. The use of a lock-in amplifier helps to remove variations in the transmitted intensity from other sources. The resulting signal is then analysed to determine the deviation from mode centre, and the DBR section current of the laser is adjusted to reduce this deviation.

Tuneable lasers will generally make use of a lookup table to relate the tuning parameters (e.g. phase section current, heat applied to a thermally tuned DBR section, current applied to an electronically tuned DBR section, overall chip temperature etc.) to the output frequency. When a deviation from mode centre is detected, this lookup table may be updated to ensure that it is kept properly calibrated despite the drift in mode boundaries. While during normal operation, the frequency and mode centre locking would ensure that the desired frequency is output anyway, updating the lookup table will cause the laser to operate at the desired frequency more quickly after startup or a switch from one channel to another.

The invention claimed is:

1. A distributed Bragg reflector (DBR) laser, the DBR laser comprising:
   a phase section in a cavity of the DBR laser and configured to adjust an optical path length of the cavity;
   a DBR section comprising a frequency tuning system configured to adjust a Bragg frequency of the DBR section;
   a detector configured to detect laser light transmitted through the DBR section;
   a controller configured:
      to cause the phase section to apply a dither to the optical path length of the cavity or cause the frequency tuning system to apply a dither to the Bragg frequency of the DBR section;
      to use the detector to monitor intensity of light transmitted from the cavity via the DBR section during application of the dither;
      to determine a deviation from longitudinal mode centre operation on the basis of the monitored intensity; and
      to cause the frequency tuning system to adjust the Bragg frequency of the DBR section in order to reduce said deviation, or cause the phase section to adjust the optical path length of the cavity in order to reduce said deviation.

2. The DBR laser according to claim 1, wherein the detector is located on a chip containing the DBR section and phase controller.

3. The DBR laser according to claim 2, wherein the detector comprises an inline tap.

4. The DBR laser according to claim 1, wherein the detector is a photodiode.

5. The DBR laser according to claim 4, wherein the detector is a power reference photodiode of a wavelength locker of the laser.

6. The DBR laser according to claim 1, wherein determining the deviation from the longitudinal mode centre operation comprises determining a difference between the Bragg frequency of a rear DBR section and a frequency of a longitudinal mode of the cavity.

7. The DBR laser according to claim 1, wherein determining the deviation from the longitudinal mode centre operation comprises determining a local minimum of the monitored intensity.

8. The DBR laser according to claim 1, wherein the frequency tuning system is a thermal tuning system.

9. The DBR laser according to claim 1, wherein the frequency tuning system is an electronic tuning system.

10. The DBR laser according to claim 9, wherein the DBR section comprises a waveguide having a counter-chirp structure.

11. The DBR laser according to claim 1, wherein the detector comprises a lock-in amplifier tuned to an oscillation frequency of the dither.

12. The DBR laser according to claim 1, wherein the controller is configured, following detection of a deviation from mode centre, to adjust a lookup table of frequency versus tuning parameters of the DBR laser on the basis of the detected deviation.

13. A method of operating a distributed Bragg reflector (DBR) laser, the method comprising:
    applying a dither to one or both of a Bragg frequency of a DBR section of the DBR laser and an optical path length of a cavity of the DBR laser;
    monitoring intensity of light transmitted through the DBR section of the DBR laser;
    determining a deviation from longitudinal mode centre operation on the basis of the monitored intensity; and
    adjusting either the Bragg frequency of the DBR section or the optical path length of the cavity in order to reduce said deviation.

14. The method according to claim 13, wherein determining the deviation from mode centre comprises determining a minimum of the monitored intensity.

15. The method according to claim 13, further comprising adjusting a lookup table of frequency versus tuning parameters of the DBR laser on the basis of the deviation.

16. The method according to claim 13, wherein the dither is applied to the Bragg frequency of the DBR section and/or the optical path length of the cavity using thermal tuning.

17. A non-transitory computer readable-medium program: configured
    to store program code instructions which, when executed by a process of a controller of a distributed Bragg reflector (DBR) laser, causes the DBR laser to performs steps comprising:
    applying a dither to one or both of a Bragg frequency of a DBR section of the DBR laser and an optical path length of a cavity of the DBR laser;
    monitoring intensity of light transmitted through the DBR section of the DBR laser;
    determining a deviation from longitudinal mode centre operation on the basis of the monitored intensity; and
    adjusting either the Bragg frequency of the DBR section or the optical path length of the cavity in order to reduce said deviation.

18. The non-transitory computer readable-medium program according to claim 17, wherein determining the deviation from the longitudinal mode centre operation comprises determining a difference between the Bragg frequency of a rear DBR section and a frequency of a longitudinal mode of the cavity.

19. The non-transitory computer readable-medium program according to claim 17, wherein determining the deviation from the longitudinal mode centre operation comprises determining a local minimum of the monitored intensity.

20. The non-transitory computer readable-medium program according to claim 17, wherein the DBR section comprises a waveguide having a counter-chirp structure.

* * * * *